US005410205A

United States Patent [19]

Gururaja

[11] Patent Number: 5,410,205

[45] Date of Patent: Apr. 25, 1995

[54] ULTRASONIC TRANSDUCER HAVING TWO OR MORE RESONANCE FREQUENCIES

[75] Inventor: Turuvekere R. Gururaja, North Andover, Mass.

[73] Assignee: Hewlett-Packard Company, Palo Alto, Calif.

[21] Appl. No.: 16,373

[22] Filed: Feb. 11, 1993

[51] Int. Cl.[6] .......... H01L 41/08

[52] U.S. Cl. .......... 310/328; 310/321; 310/334

[58] Field of Search .......... 310/321, 322, 328, 334

[56] References Cited

U.S. PATENT DOCUMENTS

| | | | |
|---|---|---|---|
| 2,589,403 | 3/1952 | Kurie | 310/334 |
| 3,093,760 | 6/1963 | Tarasevich | 310/321 |
| 3,401,377 | 5/1967 | Bartlett et al. | 310/328 |
| 3,462,746 | 8/1969 | Bartlett | 310/326 |
| 4,096,756 | 6/1978 | Alphonse | 310/317 |
| 4,101,795 | 7/1978 | Fukumoto et al. | 310/336 |
| 4,145,931 | 3/1979 | Tancrell | 73/626 |
| 4,211,948 | 7/1980 | Smith et al. | 310/322 |
| 4,240,003 | 12/1980 | Larson, III | 310/326 |
| 4,277,711 | 7/1981 | Hanafy | 310/334 |
| 4,356,422 | 10/1982 | van Magnon | 310/322 |
| 4,366,406 | 12/1982 | Smith et al. | 310/334 |
| 4,367,426 | 1/1983 | Kumada et al. | 310/322 |
| 4,385,255 | 5/1983 | Yamaguchi et al. | 310/335 |
| 4,400,634 | 8/1983 | Micheron | 307/400 |
| 4,616,152 | 10/1986 | Saito et al. | 310/334 |
| 4,658,155 | 4/1987 | Ohba | 307/154 |
| 4,695,988 | 9/1987 | Banno | 310/800 |
| 4,736,631 | 4/1988 | Takeuchi et al. | 73/649 |
| 4,835,747 | 5/1989 | Billet | 310/800 |
| 4,845,399 | 7/1989 | Yasuda et al. | 310/366 |
| 4,915,115 | 4/1990 | Sasaki et al. | 128/660.05 |
| 4,939,826 | 7/1990 | Shoup | 29/25.35 |
| 5,025,790 | 6/1991 | Dias | 128/662.03 |
| 5,083,056 | 1/1992 | Kondou et al. | 310/332 |
| 5,163,436 | 11/1992 | Saitoh et al. | 128/662.03 |
| 5,241,233 | 8/1993 | Culp . | |

FOREIGN PATENT DOCUMENTS

| | | | |
|---|---|---|---|
| 190948 | 8/1986 | European Pat. Off. | G10K 11/34 |
| 3142684 | 5/1983 | Germany | 310/332 |
| 3430161 | 2/1986 | Germany | 310/334 |
| 45-23667 | 8/1970 | Japan | 310/334 |
| 58-63300 | 4/1983 | Japan | H04R 17/00 |
| 60-41399 | 8/1983 | Japan | H04R 17/00 |
| 60-98799 | 6/1985 | Japan | H04R 17/00 |
| 0208200 | 10/1985 | Japan | 310/334 |
| 2044582 | 10/1980 | United Kingdom | H04R 17/00 |
| 2059716 | 4/1981 | United Kingdom | H04R 17/00 |
| 2083695 | 3/1982 | United Kingdom | H03H 9/13 |

OTHER PUBLICATIONS

"137. Electrostriction" from the book *Piezoelectricity* by W. Cady, pp. 198 and 199.

D. Larson, "Non-Ideal Radiators in Phased Array Transducers", Hewlett-Packard Laboratories,IEEE 1981, 1981 Ultrasonics Symposium, pp. 673–684.

Fraguier et al, "A Novel Acoustic Design for Dual Frequency Transducers . . . ", Proc. of 1990 Ultrasonics Symposium, pp. 799–803.

W. A. Smith, "New Opportunities in Ultrasonic Trans. Emerging From Innovations in Piezoelectric Mat.", 1992 SPIE Intl. Symp., Jul. 1992, pp. 1–24.

*Primary Examiner*—Thomas M. Dougherty

[57] ABSTRACT

A transducer for transmitting and receiving ultrasonic energy at more than one frequency includes first and second electrostrictive layers mechanically coupled together such that ultrasonic vibrations in one layer are coupled into the other layer. The first electrostrictive layer is laminated between upper and middle electrical contact layers, and the second electrostrictive layer is laminated between middle and lower electrical contact layers. A bias voltage arrangement selectively produces within the first and second electrostrictive layers electric fields oriented in opposite directions or electric fields oriented in the same direction. When the electric fields are oriented in opposite directions, the transducer has a first resonance frequency. When the electric fields are oriented in the same direction, the transducer has a second resonance frequency. By selecting the number of electrostrictive layers in a transducer and by selecting the thicknesses of different layers, a transducer having two or more different desired resonance frequencies may be produced.

19 Claims, 1 Drawing Sheet

ULTRASONIC TRANSDUCER HAVING TWO OR MORE RESONANCE FREQUENCIES

FIELD OF THE INVENTION

This invention relates to ultrasonic transducers and, more particularly, to ultrasonic transducers capable of transmitting and/or receiving ultrasonic signals at two or more frequencies.

BACKGROUND OF THE INVENTION

Ultrasonic transducers are used in a wide variety of applications wherein it is desirable to view the interior of an object noninvasively. For example, in medical applications, without making incisions or other breaks in the skin, much diagnostic information may be obtained from an ultrasonic image of the interior of a human body. Thus, ultrasonic imaging equipment, including ultrasonic probes and associated image processing equipment, has found widespread medical use.

However, the human body is not acoustically homogeneous. Depending upon which structures of the human body are serving as an acoustic transmission medium and which structures are the targets to be imaged, different frequencies of operation of an ultrasonic probe device may be desirable.

Current ultrasonic probes include a transducer or a transducer array which is optimized for use at one particular frequency. When differing applications require the use of different ultrasonic frequencies, a user typically selects a probe which operates at or near a desired frequency from a collection of different probes. Thus, a variety of probes, each having a different operating frequency, is often required with acoustic imaging equipment currently in use, adding to the complexity of use and the cost of the equipment.

Prior art dual frequency ultrasonic transducers utilize a transducer with a relatively broad resonance peak. Desired frequencies are selected by filtering. Current commercially available dual frequency transducers have limited bandwidth ratios, such as 2.0/2.5 MHz or 2.7/3.5 MHz. Graded frequency ultrasonic sensors that compensate for frequency downshifting in the body are disclosed in U.S. Pat. No. 5,025,790, issued Jun. 25, 1991 to Dias.

Probes currently in use, such as mentioned above, typically include an impedance matching layer. This layer matches the acoustic impedance of the transducer or transducer array to the acoustic impedance of an object under examination, such as a human body. However, impedance matching layers currently in use are frequency selective. That is, they correctly match the transducer impedance to the impedance of the object under examination only over a narrow band of frequencies. Therefore, current impedance matching layers act as filters, further limiting the usable bandwidth of a probe.

SUMMARY OF THE INVENTION

This invention is based on using a material which is highly polarizable by application of a D.C. bias voltage, the material thereby exhibiting piezoelectric properties. The material loses its polarization upon removal of the D.C. bias voltage and no longer exhibits piezoelectric properties. This property of turning the piezoelectric effect ON or OFF by the presence or absence of D.C. bias voltage can be observed, for example, in materials which are preferably maintained in the vicinity of their ferroelectric to paraelectric phase transition temperatures. The ferroelectric phase exhibits piezoelectric properties whereas the pareelectric phase does not. Materials having the above described properties are referred to herein as electrostrictive materials.

According to the present invention, an electrostrictive transducer for transmitting and receiving ultrasonic energy at more than one frequency comprises first and second electrostrictive layers mechanically coupled together such that ultrasonic vibrations in one layer are coupled into the other layer, and means for selectively producing within the first and second electrostrictive layers electric fields oriented in opposite directions or electric fields oriented in the same direction. The transducer has a first resonance frequency when the electric fields are oriented in opposite directions and has a second resonance frequency when the electric fields are oriented in the same direction. The transducer can comprise a single element or an array of elements.

The means for selectively producing electric fields within the first and second electrostrictive layers preferably comprises upper, middle and lower conductive electrical contact layers and means for applying bias voltages to the upper, middle and lower electrical contact layers. The first electrostrictive layer is disposed between the upper and middle electrical contact layers, and the second electrostrictive layer is disposed between the middle and lower electrical contact layers. In a preferred embodiment, the first and second electrostrictive layers have equal thicknesses and the first resonance frequency is one half of the second resonance frequency.

The polarization direction of each electrostrictive layer is selected independently of each other electrostrictive layer by applying a bias voltage of a selected polarity across each layer. Because an electrostrictive material does not retain a permanent polarization, different polarization directions may be selected for each layer at different times during use of the device. Such a structure exhibits thickness mode resonance at two or more distinct frequencies, depending upon the number of electrostrictive layers, the thickness of each layer, and the polarities of the bias voltages applied to the electrical contact layers.

Ultrasonic acoustic probes often use a matching layer between the transducer element and the object to be examined, as discussed above. In an ultrasonic probe constructed according to the present invention, the matching layer may be provided with a graded acoustic impedance, so as to properly match the transducer to an object under examination at the two or more frequencies of operation.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
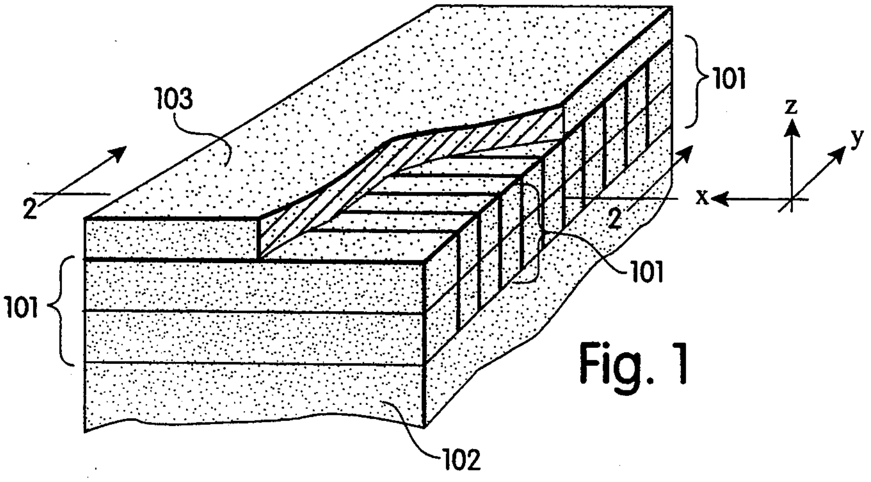
FIG. 1 is a perspective view of one embodiment of a transducer array according to the present invention.

An embodiment of the present invention is now described with reference to the figures. The general construction of a transducer array according to the present invention is described with respect to FIG. 1. The transducer array of FIG. 1 includes a series of electrostrictive elements 101 disposed side-by-side on a backing layer 102. Backing layer 102 may be a damping layer with an appropriate acoustic impedance to optimize the sensitivity, bandwidth or pulse length of the transducer. Typical arrays may include tens to hundreds of elements, each 100–600 microns wide in the y-direction. Each electrostrictive element 101 may typically be between 0.5 and 2 cm long in the x-direction. The elements 101 are physically separated so that they can be individually energized. Depending upon the frequencies of operation of the array, elements 101 may be 0.1–2 mm high in the z-direction. Such elements may operate at frequencies from the low megahertz to the tens of megahertz. A typical array is between 1 and 6 cm long in the y-direction. The dimensions disclosed are suitable for a wide range of medical applications, but other applications may call for dimensions outside the disclosed ranges, which may be readily calculated by those skilled in the art. The array of electrostrictive elements 101 may be covered with an impedance matching layer 103.

Electrostrictive elements 101 are excited by voltages applied as described below in connection with FIGS. 2 and 3. Acoustic energy generated in the array is transmitted through impedance matching layer 103 into an object under examination, a human body for example.

An electrostrictive material is highly polarizable by application of a D.C. bias voltage, the material thereby exhibiting piezoelectric properties. The electrostrictive material loses its polarization upon removal of the D.C. bias voltage and no longer exhibits piezoelectric properties. Electrostrictive elements 101 may be made of any suitable electrostrictive material. Two examples of such materials include lead-magnesium-niobate modified with lead-titanate, and barium-strontium-titanate. In general, materials having a phase transition near room temperature are suitable. Phase transitions of interest include those between ferro-electric and para-electric properties or between ferro-electric and anti-ferro-electric properties.

Furthermore, elements 101 need not be made of a single ceramic material such as noted above, but may be a composite of a ceramic electrostrictive material in a polymer matrix or may be a non-ceramic electrostrictive material. Many suitable types of electrostrictive materials are known to those skilled in the art.

While it is preferable to choose material having its phase transition at or near the temperature of operation of the material, this is not required. For example, if the material is operated at a temperature much higher than the transition temperature, it requires a larger D.C. bias voltage. If the material is operated much below the transition temperature, the induced piezoelectric effect may not fully disappear upon removal of the bias voltage.

Figure 2:
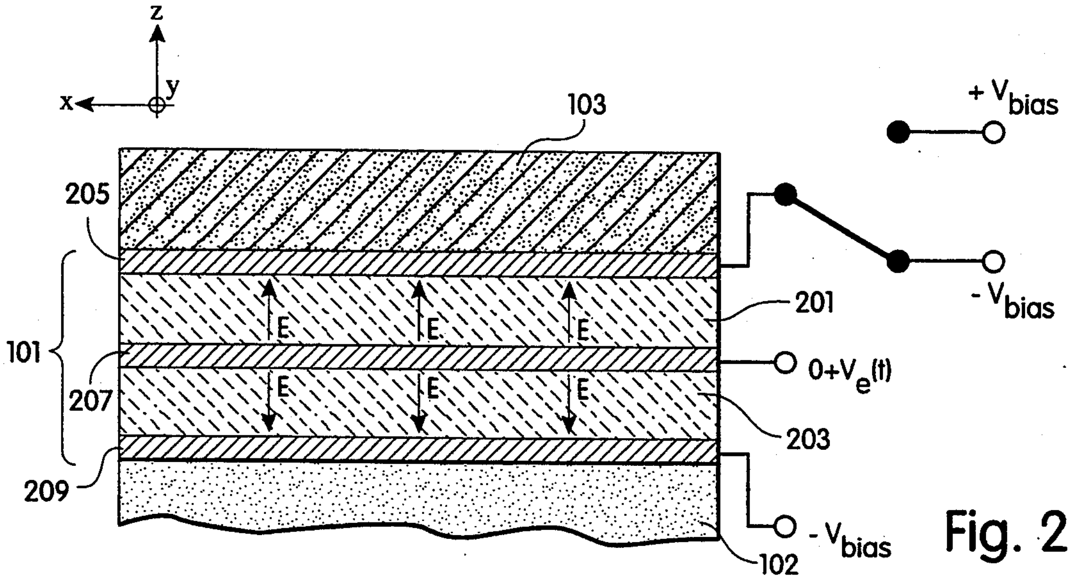
FIG. 2 is a cross-sectional view of the embodiment of FIG. 1, taken along the line 2—2, and showing one mode of operation of the transducer.

As seen in the cross-sectional view of FIG. 2, element 101 includes two layers of electrostrictive material 201 and 203. Each of the electrostrictive layers 201 and 203 is disposed between a pair of conductive electrical contact layers. Electrostrictive layer 201 is disposed between conductive electrical contact layers 205 and 207, while electrostrictive layer 203 is disposed between conductive electrical contact layers 207 and 209. The electrical contact layer 207 between electrostrictive layers 201 and 203 is sufficiently thin that ultrasonic vibrations are mechanically coupled between layers 201 and 203.

Figure 3:
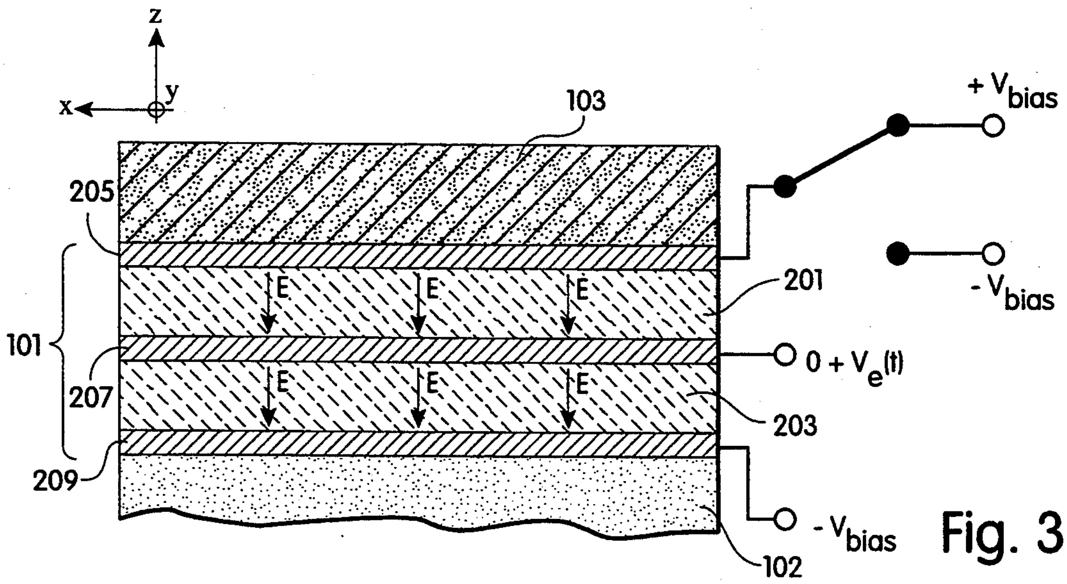
FIG. 3 is the cross-section of FIG. 2, showing a second mode of operation of the transducer.

This structure may be excited to produce two different output frequencies and is now described with respect to FIGS. 2 and 3. In a first mode, denoted by the voltages at the right side of FIG. 2, the outermost contact layers 205 and 209 are held at bias potentials of $-V_{bias}$ with respect to central contact layer 207. Central contact layer 207 is then excited by a voltage $V_e(t)$. Excitation voltage $V_e(t)$ may be a short, D.C. rectangular pulse, for example. An electric field is set up by the bias voltage, $V_{bias}$, in each of the electrostrictive layers 201 and 203. The electric fields within the layers 201 and 203 are oriented in opposite directions, as indicated by the arrows E in FIG. 2. This structure exhibits a thickness mode resonance at a frequency $F_1$ determined by:

$$F_1 = v/4*h,$$

where v is the velocity of sound in layers 201 and 203 and h is the height (thickness) of each layer in the z-direction.

If the applied voltages are changed as shown in FIG. 3, then the thickness mode resonance frequency is altered. In a second mode, denoted by the voltages at the right side of FIG. 3, outer contact layer 205 is held at a bias potential $+V_{bias}$, while outer contact layer 209 is held at $-V_{bias}$ volts. The central contact layer 207 is held at zero volts. Thus, the electric fields in the layers 201 and 203 are oriented in the same direction, as indicated by the arrows E in FIG. 3. Central contact layer 207 is then excited by voltage $V_e(t)$. As a result, the resonance frequency of this mode, $F_2$, is determined by:

$$F_2 = v/2*h$$

It is clear from the equations describing $F_1$ and $F_2$ that $F_2$ is two times $F_1$.

Typical thickness mode resonance frequencies range from the low megahertz to tens of megahertz as discussed above. The excitation voltages applied may be square pulses. Electric fields to obtain an adequate piezoelectric coupling constant may be about 2–20 kv/cm. Since the required field depends on the electrostrictive material used, this range should not be considered limiting. For electrostrictive layers 0.5 mm thick, the applied voltages corresponding to the above electric fields may be about 100 volts–1000 volts. In a multilayer configuration having a fixed total thickness, increasing the number of layers results in thinner layers. Thus, to obtain the required E fields, smaller bias voltages may be used. For example, the embodiment described above may use 0.5 mm layers and a bias voltage of about 100–1000 volts. A four-layer embodiment capable of producing the same minimum frequency would have layers 0.25 mm thick. Therefore, the bias voltage for each layer would be about 50–500 volts.

The first mode, shown in FIG. 2, and the second mode, shown in FIG. 3, produce different frequencies as follows. When the structure is biased as shown in FIG. 2, then the fields produced by the excitation voltage $V_e(t)$ in each of layers 201 and 203 are in the same direction as the D.C. bias fields (denoted E). The structure resonates in the same manner as a single layer whose thickness is the sum of the thicknesses of layers 201 and 203.

In contrast, when the structure is biased as shown in FIG. 3, then the field produced by the excitation voltage $V_e(t)$ in layer 203 is in the same direction as the D.C. bias field (denoted E) in layer 203, but the field produced by the excitation voltage $V_e(t)$ in layer 201 is in the opposite direction from the D.C. bias field (denoted E) in layer 201. The structure resonates in the same manner as a single layer whose thickness is equal to the thickness of layer 201 or 203. As will be seen below, this behavior enables one to design transducers having various frequencies of operation using the equations known to describe resonant bodies.

The above description relates to the case where the thicknesses of layers 201 and 203 are equal. By selecting different thicknesses for layers 201 and 203, the ratios of the two resonance frequencies may be varied. By selecting the number of electrostrictive layers in a transducer and by selecting the thicknesses of different layers, a transducer having two or more different desired resonance frequencies may be produced. The bias voltages applied to the transducer can be changed as described above to control the resonance frequencies. Many variations, for example in size and application of these transducers, will now be readily apparent to those skilled in the art. It will be understood that the resonance frequency of the transducer determines the frequency at which ultrasonic energy is transmitted by the transducer and the frequency at which ultrasonic energy is received by the transducer and converted to an electrical signal.

The resonance frequency of the transducer of the present invention is determined, in part, by the bias voltages applied to the layers, thus permitting electronic control of the resonance frequency. In one application of the transducer of the present invention, a pulse is transmitted at one resonance frequency. After the ultrasound pulse is transmitted, the bias voltages applied to the transducer layers are switched so as to receive at a different resonance frequency. Such operation may be useful when the transmitted ultrasound energy is shifted in frequency in the target region or when elements within the target region resonate at frequencies different from the transmitted frequency.

In another application of the transducer of the present invention, a transducer transmits and receives at one resonance frequency for normal two-dimensional ultrasound imaging. Periodically the bias voltages applied to the layers of the transducer are switched such that the transducer transmits and receives at a lower resonance frequency for Doppler flow imaging.

In general, it will be understood that the transducer of the present invention permits operation at widely spaced resonance frequencies with a single transducer. Furthermore, the resonance frequencies can be electronically switched during operation. Electronic switching of bias voltages can be performed by techniques well known to those skilled in the art.

Calculation of the thicknesses required to generate desired thickness mode resonant frequencies are well within the ability of those skilled in the art. The frequency of an acoustic wave $F \cong v/\lambda$, where v is the velocity of sound in the medium carrying the acoustic wave and $\lambda$ is the wavelength of a wave of frequency F in the medium. Furthermore, if F is set to the thickness mode resonant frequency of the medium carrying the acoustic wave, then $F=(c/\rho)^{\frac{1}{2}}/2h$, where c is the stiffness of the resonant body, $\rho$ is the density of the resonant body and h is the height of the resonant body. Thus, starting with the material properties of the medium, one may calculate the thicknesses required to generate any particular desired resonant frequency. By applying the above equation and transmission line theory to the structure shown in the drawings and described above, any desired set of resonance frequencies may be generated.

Construction of the multi-layered structures of the present invention may be by any one or combination of known ceramic or ceramic composite processing techniques. The described construction method begins with either the preparation of a ceramic wafer or a ceramic composite wafer whose thickness equals the thickness of one layer of the desired structure. The desired electrical contact layers may then be vacuum deposited, sputtered or screen printed onto that wafer. Additional wafers and electrical contact layers may be bonded to this basic structure in an acoustically matched manner, also using conventional techniques known to those skilled in the art.

Although the specific embodiment described has the form of a phased array or a linear array, any number of elements 101 suitable to a particular transducer type and application may be used. For example, transducers are often built using but a single transducer element 101. The behavior and construction of such an isolated element is the same as described above with respect to each element 101 of a phased array or a linear array.

As noted earlier, it is desirable to include an impedance matching layer 103 between elements 101 and an object under examination. Such a layer may be a modified solid material for example a polymer loaded with a powder. For example, the powder may be aluminum oxide, distributed through the polymer to adjust the acoustic impedance of the layer. However, such a layer, matched at frequency f, will have an acoustic thickness of $\lambda_1/4$ at the wavelength $\lambda_1$ corresponding to frequency f, but will have an acoustic thickness of $\lambda_2/2$ at a wavelength $\lambda_2$ corresponding to the frequency 2f. Therefore, the layer will not be properly matched at frequency 2f. A compromise thickness between $\lambda_1/4$ and $\lambda_2/4$ could be chosen. Preferably, the impedance matching layer would be sufficiently broad band to match the transducer to the object under examination at all of the frequencies of interest.

One way to achieve a broad band matching layer 103 is to construct the layer of a material which has been loaded with a powder wherein the density of loading varies from the surface of matching layer 103 adjacent the transducer to the surface of matching layer 103 adjacent the object under examination. One suitable grading function is an exponential distribution of the powder, more heavily loaded at the transducer element surface. Two methods for constructing such a layer are now described.

In one method, an uncured base polymer may be loaded with a powder. The uncured polymer is then centrifuged to distribute the powder in a graded fashion. Finally, the centrifuged polymer is cured in place, thus setting into the cured solid the powder density grading that was achieved during the centrifuging step. The cured polymer may then be cut into wafers of an appropriate size and thickness for use.

In a second method of constructing matching layer 103, the matching layer 103 may be a lamination of a plurality of thin sheets of polymer, each having a different, uniform density of powder loaded therein. Using this technique the density of powder at any distance from a surface of the structure may be varied to produce a wide variety of grading functions from the surface of matching layer 103 adjacent the transducer to the surface of matching layer 103 adjacent the object under examination.

While there have been shown and described what are at present considered the preferred embodiments of the present invention, it will be obvious to those skilled in the art that various changes and modifications may be made therein without departing from the scope of the invention as defined by the appended claims.

What is claimed is:

1. An electrostrictive transducer for transmitting and receiving ultrasonic energy at more than one frequency, comprising:

at least three spaced-apart conductive electrical contact layers;

first and second electrostrictive layers disposed between adjacent pairs of said electrical contact layers to form a laminated structure; and bias means for selectively producing biasing electric fields oriented in opposite directions or biasing electric fields oriented in the same direction in said first and second electrostrictive layers, said transducer having a first resonance frequency when said biasing electric fields are oriented in opposite directions and having a second resonance frequency when said biasing electric fields are oriented in the same direction.

2. An electrostrictive transducer as defined in claim 1 wherein said first and second electrostrictive layers have equal thicknesses and wherein said first resonance frequency is one half of said second resonance frequency.

3. An electrostrictive transducer as defined in claim 1 wherein said first and second electrostrictive layers have unequal thicknesses.

4. An electrostrictive transducer as defined in claim 1 further including an impedance matching layer on a first surface of said laminated structure.

5. An electrostrictive transducer as defined in claim 4 further including an acoustically optimized backing layer on a second surface of said laminated structure opposite said first surface.

6. An electrostrictive transducer as defined in claim 4 wherein the matching layer comprises a solid body having a powder with a density that is graded from one surface of the solid body to an opposite surface of the solid body.

7. An electrostrictive transducer as defined in claim 4 wherein the impedance matching layer comprises a laminate comprising a plurality of layers, each having a uniform powder density independent of each other layer.

8. An electrostrictive transducer as defined in claim 6 wherein the grading is exponential from the one surface of the solid body to the opposite surface of the solid body.

9. An electrostrictive transducer as defined in claim 1 wherein said bias means includes means for electronically switching the resonance frequency of said transducer during operation.

10. An electrostrictive transducer as defined in claim 9 wherein said means for electronically switching the resonance frequency of said transducer include means for transmitting at one resonance frequency and for receiving at a different resonance frequency.

11. An electrostrictive transducer for transmitting and receiving ultrasonic energy at more than one frequency, comprising:

a backing layer; and a plurality of electrostrictive transducer elements disposed on the backing layer in an array, each of the electrostrictive elements comprising first and second electrostrictive layers disposed between conductive electrical contact layers in a laminated structure and bias means for selectively producing biasing electric fields oriented in opposite directions or biasing electric fields oriented in the same direction in said first and second layers, each of said elements having a first resonance frequency when said biasing electric fields are oriented in opposite directions and having a second resonance frequency when said biasing electric fields are oriented in the same direction.

12. An electrostrictive transducer as defined in claim 11 further including an impedance matching layer on a surface of said laminated structure opposite said backing layer.

13. An electrostrictive transducer as defined in claim 11 wherein said first and second electrostrictive layers have equal thicknesses and wherein said first resonance frequency is one half of said second resonance frequency.

14. An electrostrictive transducer as defined in claim 11 wherein said first and second electrostrictive layers have unequal thickness.

15. An electrostrictive transducer for transmitting and receiving ultrasonic energy at more than one frequency, comprising:

first and second electrostrictive layers mechanically coupled together such that ultrasonic vibrations in one layer are coupled into the other layer; and means for selectively producing within said first and second electrostrictive layers biasing electric fields oriented in opposite directions or biasing electric fields oriented in the same direction, said transducer having a first resonance frequency when said biasing electric fields are oriented in opposite directions and having a second resonance frequency when said biasing electric fields are oriented in the same direction.

16. An electrostrictive transducer as defined in claim 15 wherein said means for selectively producing electric fields comprises:

upper, middle and lower conductive electrical contact layers, said first electrostrictive layer being disposed between the upper and middle electrical contact layers and said second electrostrictive layer being disposed between the middle and lower electrical contact layers; and bias means for applying bias voltages to the upper, middle and lower electrical contact layers.

17. An electrostrictive transducer as defined in claim 16 wherein said bias means comprises:

means for applying a reference voltage to the middle electrical contact layer;

means for applying to the upper and lower electrical contact layers bias voltages of the same polarity relative to the reference voltage when operating at said first resonance frequency; and means for applying to the upper and lower electrical contact layers bias voltages of opposite polarities relative to the reference voltage when operating at said second resonance frequency.

18. An electrostrictive transducer as defined in claim 17 wherein said bias voltages have equal magnitudes relative to said reference voltage.

19. An electrostrictive transducer as defined in claim 16 wherein said bias means includes means for electronically switching the resonance frequency of said transducer during operation.

* * * * *